(12) United States Patent
Boyko et al.

(10) Patent No.: US 6,212,769 B1
(45) Date of Patent: Apr. 10, 2001

(54) PROCESS FOR MANUFACTURING A PRINTED WIRING BOARD

(75) Inventors: Christina M. Boyko, Endicott; Robert J. Day, Dryden; Kristen A. Stauffer, Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/343,077

(22) Filed: Jun. 29, 1999

(51) Int. Cl.[7] ....................................................... H05K 3/30
(52) U.S. Cl. ................................ 29/852; 29/846; 29/853; 427/97; 427/96
(58) Field of Search ............................. 29/846, 852, 853; 427/97, 98, 96; 156/643; 216/17; 205/125

(56) References Cited

U.S. PATENT DOCUMENTS

| | | |
|---|---|---|
| 3,625,758 | 12/1971 | Stahl et al. . |
| 3,854,973 | 12/1974 | Merserau et al. . |
| 3,930,963 | 1/1976 | Polichette et al. . |
| 4,217,182 | 8/1980 | Cross . |
| 4,689,111 * | 8/1987 | Chan et al. ........................ 156/643 |
| 5,044,073 | 9/1991 | Ogasawara et al. . |
| 5,139,642 * | 8/1992 | Randolph et al. ................... 205/125 |
| 5,509,557 | 4/1996 | Jimarez et al. . |
| 5,690,837 * | 11/1997 | Nakaso et al. ......................... 216/17 |

* cited by examiner

*Primary Examiner*—Lee Young
*Assistant Examiner*—Rick Kiltae Chang
(74) *Attorney, Agent, or Firm*—Salzman & Levy; Lawrence R. Fraley

(57) ABSTRACT

The present invention teaches a simplified process for fabricating high density printed wiring boards using a semi-additive process. A roughened copper foil is laminated to a dielectric substrate. The foil is subsequently removed from the dielectric to create a roughened, irregular surface on the dielectric substrate. Vertical angle through holes and blind holes are formed in the substrate. A uniform copper commoning layer is electrolessly plated to the roughened dielectric substrate and through holes. A photoresist is applied on the surface of the electroless plated layer and irradiated through a mask having printed circuit features. After developing the photoresist the uncovered electroless layer is electrolytically plated to create the final features and circuitry. After stripping the remaining photoresist the unplated electroless copper layer is etched to electronically isolate the copper features and circuitry lines.

12 Claims, 6 Drawing Sheets

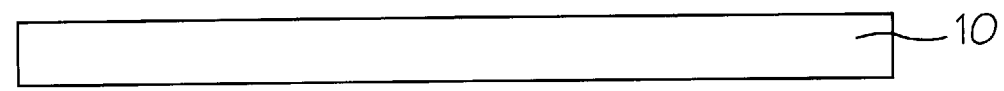
*Figure 1a*
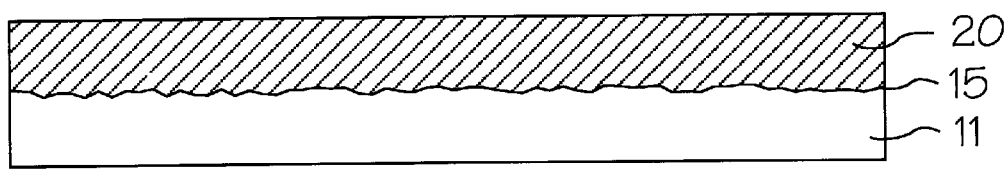
*Figure 1b*
*Figure 1c*
*Figure 1d*
*Figure 1e*
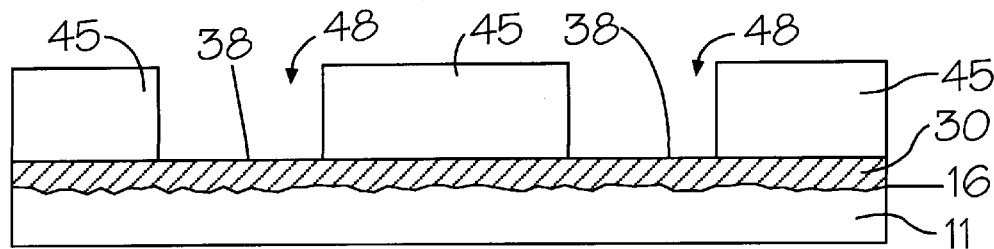
*Figure 1f*

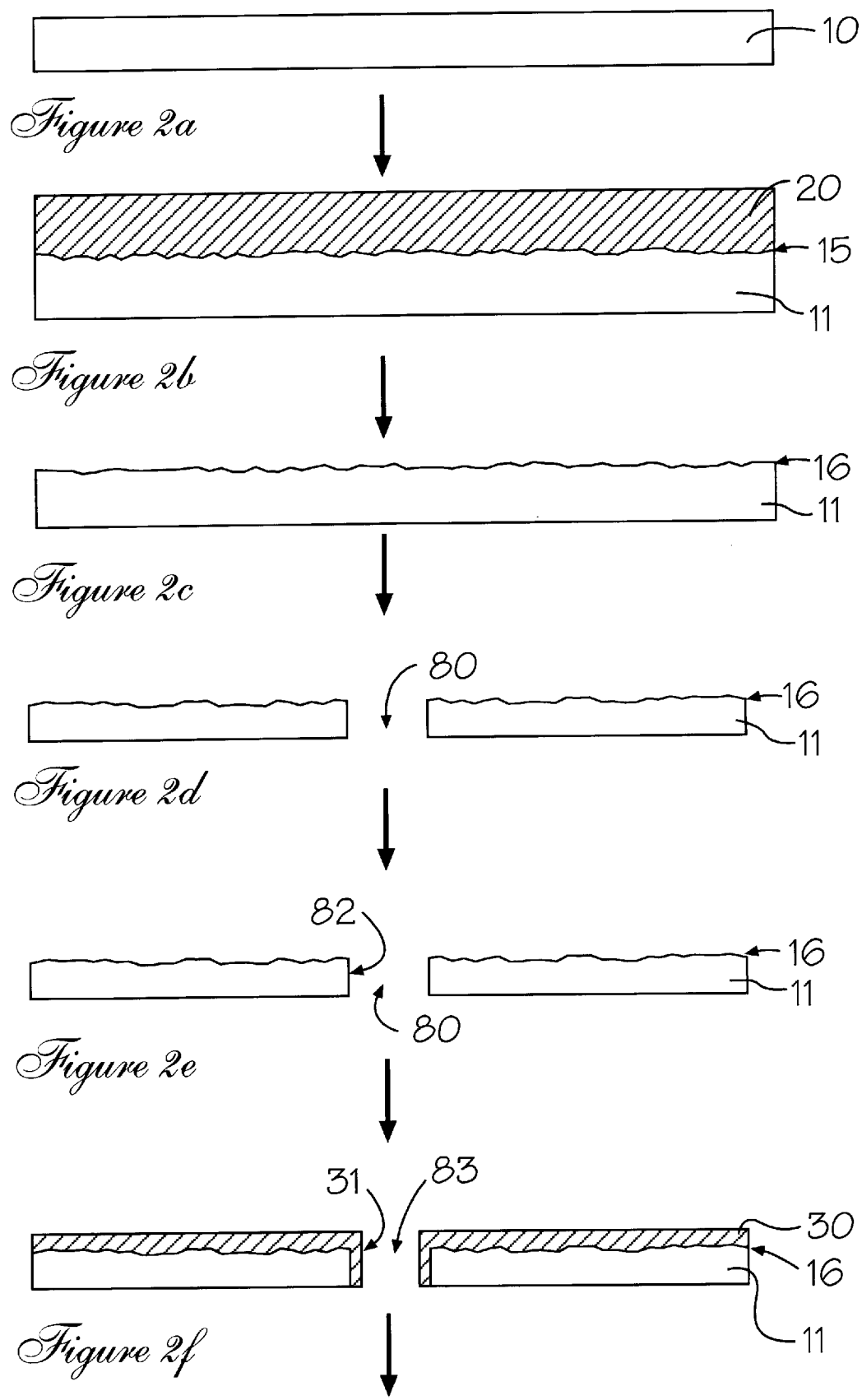

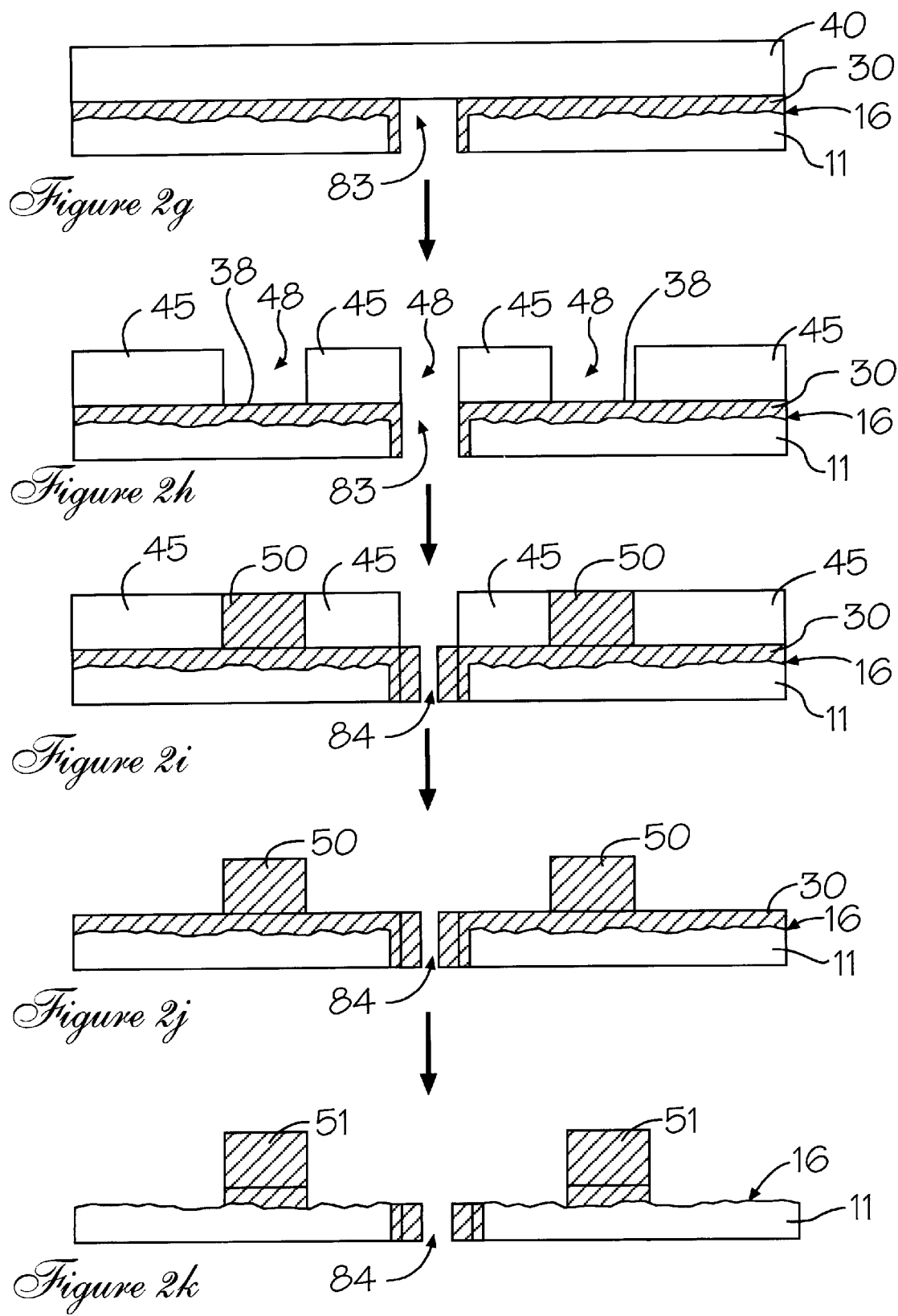

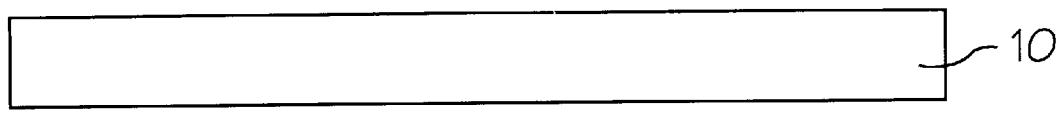
*Figure 4a*
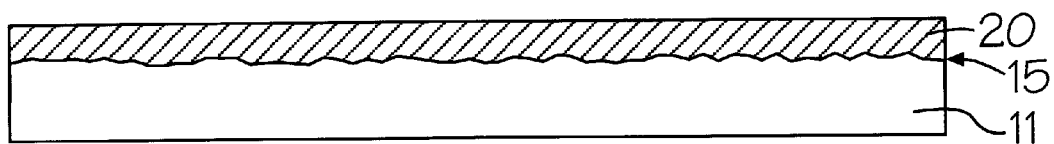
*Figure 4b*
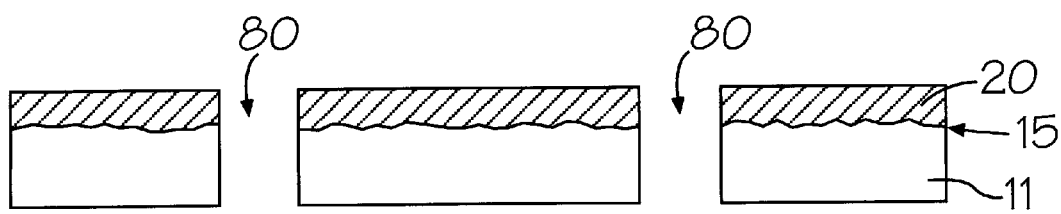
*Figure 4c*
*Figure 4d*

PROCESS FOR MANUFACTURING A PRINTED WIRING BOARD

FIELD OF INVENTION

The present invention relates to a process for manufacturing microelectronic circuitry for printed wiring boards especially with regard to laminate chip carriers. This semi-additive process allows the fabrication of high density circuitry on printed wiring boards having high-aspect plated through holes in high yield with minimal manufacturing steps.

BACKGROUND OF THE INVENTION

As is well known in the art, miniaturization of computer components is a highly desirable goal and this demand has and will continue to dictate the requirement for continually smaller and smaller microelectronic components on packages such as printed wiring boards and laminate chip carriers. Typically, manufacturers employ three technologies for fabrication of such microelectronic components. These include the many varieties of subtractive, semi-additive, and full additive processes for fabricating fine line circuitry on printed wiring boards. Each of these processes has known difficulties and limitations with regard to producing high quality, high density fine-line circuitry.

The subtractive process requires that a full panel plating of copper be employed followed by imaging and developing of an overcoated resist layer and then etching of the copper in areas where the resist was removed. Major problems associated with this process include the fact that large amounts of copper must be etched away and that it is common for undercutting of the remaining circuitry to occur, especially the well known galvanic etching in areas where noble metals are present in proximity to the copper circuitry. There is also the problem of insufficient resolution using the subtractive process, this significantly limits the ultimate density of the fine line circuitry, for example it is well known that as the line or space dimension approaches the thickness of the layer to be etched, subtractive etching becomes unacceptable. To remedy this situation the etch mask must be made larger than the desired feature to allow for this lateral etching.

To circumvent these problems associated with the subtractive process (viz., large waste streams of etch materials and poor resolution due to lateral etching) the additive process has been employed. However, in the case of the additive process, problems are encountered with the need for an adhesion promoting seed layer that must be applied after the photoresist is imaged. This seed layer covers not only the desired areas to be plated but also covers the top surfaces of the photoresist layer. This could cause copper to be plated in areas not desired to be plated. To circumvent this problem, the topmost portions of the photoresist must be chemically or mechanically cleaned of the seed layer. Mechanical etching of this seed layer is known to cause physical defects in the final product due to minute particles causing conductive junctions between what should have been discrete circuit lines. Another potential defect caused by mechanical cleaning is the stress placed on the microcomponent which potentially can cause delamination. Lastly, the process itself is quite expensive due to the required buildup of copper microcircuitry via electroless plating.

To address the problems associated with both the additive and subtractive processes and to further provide electrical continuity to both sides of the substrate, a "semi-additive" process has been utilized by industry in order to make fine line high density printed wiring boards. One variant of this prior art process employs the following steps:

a) imparting an adhesion promoting process on the surface of the substrate package, typically including applying an adhesion promoting layer of a rubber-like material, b) applying a thin copper foil to the uppermost surface of the adhesion promoting layer, c) drilling the foiled substrate to create through holes either for the purpose of connecting microcircuitry on the opposing sides of the substrate or for mounting sites for other microelectronic components, d) electroless plating a thin copper layer to the through-holes and uppermost surface(s) of the foiled substrate, e) coating the uppermost surface(s) of the copper clad substrate with a resist that is then exposed and developed to generate vias to the underlying copper layer, f) electroplating additional copper into these vias to form the desired microcomponent features, g) removing the remaining photoresist, and h) etching the now uncovered, original thin copper layer and underlying copper foil to create the discrete microcomponents features and plated through holes.

The semi-additive process as practiced in the art still suffers from several problems. When either sputtering or copper foil was used as the method of applying the initial thin copper layer, the through holes would be untreated and therefore would still have essentially the insulated surface of the resin or glass substrate. This is especially true for high aspect through holes (i.e., thickness of the resin substrate is greater than 5 times the diameter of the through hole). Therefore, additional manufacturing steps were required for preparing those surfaces for plating. As described above, electroless plating of the through holes has been performed after foil lamination but problems have been encountered with adhesion between the electroless copper film plating and the copper foil. Prior art teaches the need to abrade or buff the copper foil before electroless plating in order to ensure good adhesion in the final package. The minimum thickness of the copper foil that can be applied in the semi-additive process is limited by handling problems during the lamination process and this minimum thickness is larger than would be desired in order to create extremely fine line features.

Furthermore, prior art electroless plated layers were still too thick to allow highly dense microelectronic circuitry to be prepared due to the fact that etching as known in the art is largely isotropic and therefore the etch will progress horizontally virtually to the same extent that it will occur vertically. Therefore, the thicker the layer to be etched, the wider the spacing between the features must be otherwise undercutting will become significant and adhesion problems result. In an IS&T article (1970), Celestre and Heiart described a process that involved electroless copper plating of an insulating support to give a conductive layer thickness of 0.3 mil (300 microinches). A resist is then applied, imaged and the circuit lines plated up to a thickness of 1.5 mil. Then the circuits are overplated with nickel and gold. After stripping away the resist, the electroless copper is etched away to complete the circuit panel. As can be seen in this prior art example, the initial electroless layer is approximately 20% of the thickness of the final thickness of the circuitry. As this electroless layer or foil becomes a significant percentage of the total circuit thickness, the semi-additive process in essence takes on the problematic characteristics of the subtractive process. Etching this amount of unwanted copper is not only wasteful and expensive but the process itself will cause significant undesirable lateral etching of desired circuit features. Lateral etching, therefore, limits the density of the copper circuitry by increasing both the minimum practical line width and the smallest acceptable space between features. This is true even when, as in the case cited, a metal mask such as gold/nickel is employed to protect features from attack.

Widespread use of the semi-additive process where features are plated directly onto the insulating substrate has been limited by poor adhesion between the substrate and the copper. It is desirable to obtain a printed wiring board with the greatest "peel" strength. Stahl, in U.S. Pat. No. 3,625,758, describes a semi-additive process in which a insulative base substrate material, such as phenolic paper board is brushed or sanded to clean and roughen the surface and treated with suitable activating solutions for the electroless deposition of copper. Stahl reports that a serious drawback of lack of sufficient bond between the surface of the base material and the copper conductors exists. To reduce this problem, Stahl employs an adhesive layer between the insulative base and the copper conductive layer. This package must then be heat treated and pressed to ensure sufficient adhesion.

Many other approaches have been used to alleviate this problem, but typically these either add complexity to the manufacturing process or require additional raw materials. For instance, Mersereau discloses, in U.S. Pat. No. 3,854,973, treating a base substrate in an organic solvent such as dimethyl sulfoxide followed by immersion in an appropriate chromic sulfuric acid oxidizing solution and thereafter catalyzing the surface with an appropriate electroless plating catalyst. Mersereau also employs a noble metal, overcoating the circuitry and also still recommends a baking process to effect acceptable bonding.

Polichette in U.S. Pat. No. 3,930,963, discloses an additive process for manufacturing printed wiring boards which commences with an epoxy glass laminate base material which is put through a series of chemical treatment steps, including: treatment in an absorber, drying, rinsing, punching holes, pre-activation, draining, oxidizing, and reducing to render the board surface microporous. This is followed by removing excess agents, poisoning, and applying a layer of a reducible metal compound.

Cross, in U.S. Pat. No. 4,217,182, describes the use of a semicured adhesive material applied as a layer between the dielectric support and the conductive layer. In this patent Cross describes the steps required to electrolessly plate copper onto a dielectric substrate. Starting with the untreated substrate, twelve steps were required from application of the adhesive layer to electroless plating. Cross does teach the use of a very thin electroless copper layer on the order of 15–50 microinches and this is an advancement to the art but overall the process is long and cumbersome.

Ogasawara, et al., in U.S. Pat. No. 5,044,073, describes a semi-additive process that is used to fabricate a printed wiring board. This process utilizes a two step activation process that includes a catalyzing treatment comprising a material OPC-80 and accelerating treatment comprising a material OPC-555 prior to electroless plating. This process is reportedly performed to ensure adequate bonding of the electroless copper layer to the resinous substrate. However, it is reported in this patent that a final step in the manufacture of the printed wiring board must be a surface treatment of the resin substrate that is located between the copper circuitry. This final step must be performed to remove remaining catalyst that otherwise would reduce the electrical resistance between the copper circuitry. This additional step performed with hydrazine hydrate, a known carcinogen, adds not only additional complexity to the process but since its intent is to etch the surface of the resin substrate a potential side effect is that undercutting of the substrate around the copper circuitry will occur causing a weakened bond between the substrate and the copper circuitry, this would especially be true for high density circuitry having very narrow cross-sections.

SUMMARY OF THE INVENTION

Although obvious progress has been made in the industry toward reducing the spacing between features on printed wiring boards it is acknowledged that further improvements in the art must be made in order to meet existing and future designs. For example, in 1965 high density printed wiring boards were considered to be those having conductor lines and spaces of 12 mils (0.012 inches), by 1980 that value had been reduced to 6 mils, by 1988 to 5 mils, and by 1998 to 3 mils.

With regard to the discussion hereinabove, it is the intent of this invention to provide a process that will further allow decreasing the spacing of copper features on printed wiring boards. This process is also useful when the printed wiring boards contain through holes with a high aspect ratio.

Another intent of this invention is to provide high density printing wiring boards that possess microelectronic features that exhibit excellent adhesion to the substrate and are electrically isolated from each other.

It is further the intent of this invention to provide a process that is efficient, contains minimal operating steps, and utilizes minimal raw materials thereby minimizing waste production.

These attributes, as well as others, are achieved by simplifying the process necessary for electroless plating and employing an extremely thin commoning layer as part of the semi-additive process for manufacturing printed wiring boards. This thin commoning layer is applied by electroless plating of copper onto a treated substrate. The electroless plating process in the present invention does not rely on either a resinous adhesive layer and a related baking process or an accelerator step as required in the prior art to obtain acceptable adhesion. Furthermore, since the commoning layer is extremely thin, it can be easily etched after the copper features have been fabricated so that no protection of the features (i.e. solder, gold/nickel or other metal mask) is required. Lastly, after the commoning layer is removed no further treatment of the substrate base is required to obtain electrical isolation between the copper features, even at high voltage (e.g., 500 Volts).

Generally stated, the present invention teaches a simplified process for fabricating high density printed wiring boards using a semi-additive process comprising the following steps:

a) providing a dielectric substrate b) laminating, under pressure, a copper foil to at least one outermost lateral surface of said dielectric substrate, c) completely removing said copper foil from said outermost surface of said dielectric substrate to create an irregular outermost lateral surface on said dielectric substrate, d) forming vertical angle through-holes and blind holes into said dielectric substrate, e) applying a conditioner to the irregular outermost surface to facilitate the later seeding process, f) applying a catalyst to said irregular outermost surface, through-hole surface and blind hole surface of said dielectric substrate for the purpose of applying subsequently coated layers, g) electrolessly plating a uniform copper commoning layer on said catalyst, h) applying a photoresist to the outermost lateral surface of said copper commoning layer, i) irradiating said photoresist, through a mask having printed circuit features, and developing said photoresist to generate multiple discontinuities in said photoresist, thus image wise revealing areas of said outermost surface of said copper commoning layer, j) electroplating copper onto: said exposed outermost surfaces of said commoning bar within said multiple discontinuities of said photoresist; said through hole surfaces; and said blind hole surfaces, for the purpose of generating multiple copper features and plated holes, said multiple copper features and plated holes being electrically connected to each other via association with said copper commoning layer, k) removing unexposed photoresist from step h) to uncover remaining said outermost surface of said copper commoning layer, and l) etching said remaining copper commoning layer in areas having said uncovered outermost surfaces for the purpose of creating electrical discontinuities between each of said multiple copper features and plated holes.

BRIEF DESCRIPTION OF THE DRAWINGS

A complete understanding of the present invention may be obtained by reference to the accompanying drawings, when considered in conjunction with the subsequent detailed description, in which;

FIGS. 1a–1i are cross-sectional views for explaining the steps of one embodiment of the present invention where no vias are present;

FIGS. 2a–2k are cross-sectional views for explaining the steps of one alternative embodiment containing at least one via;

FIGS. 4a–4d are cross-sectional views for explaining the steps of another alternative embodiment containing at least one via.

Figure 1G:
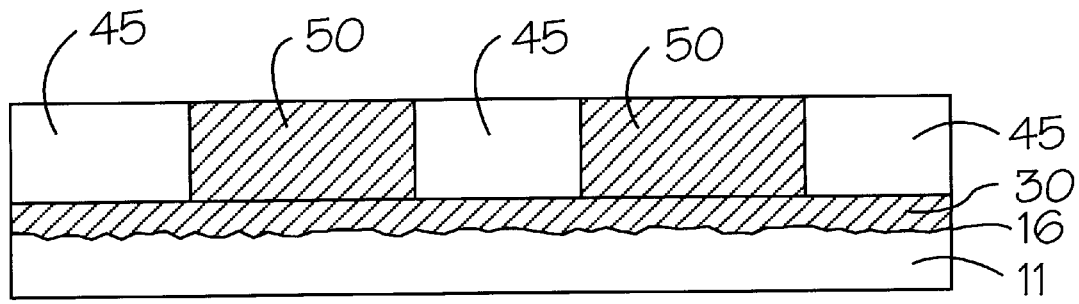
Figure 1H:
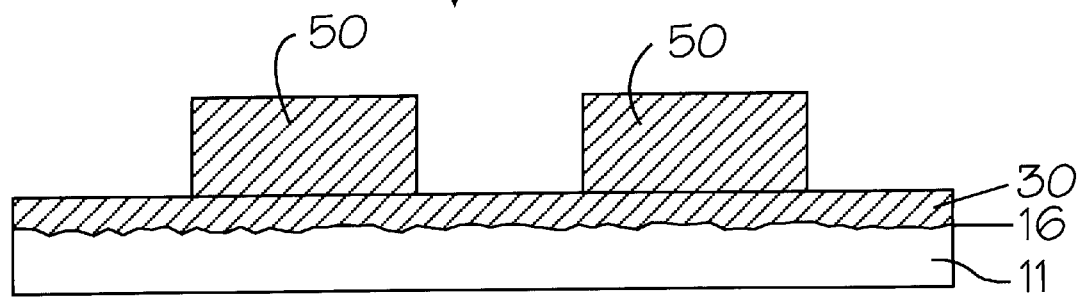
Figure 1I:
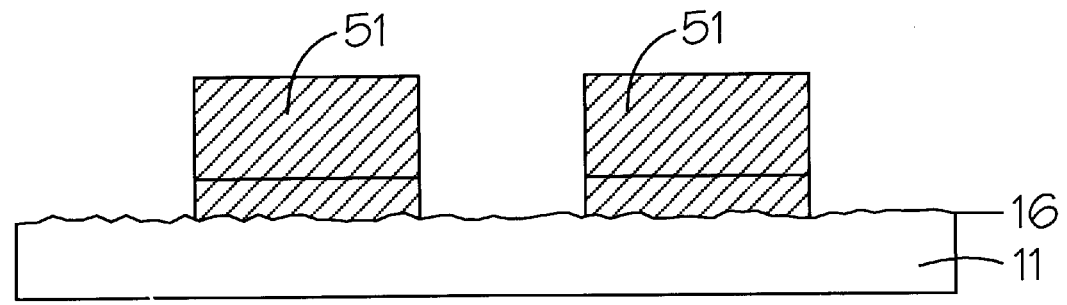
Figures 3A, 3B, 3C, 3D:
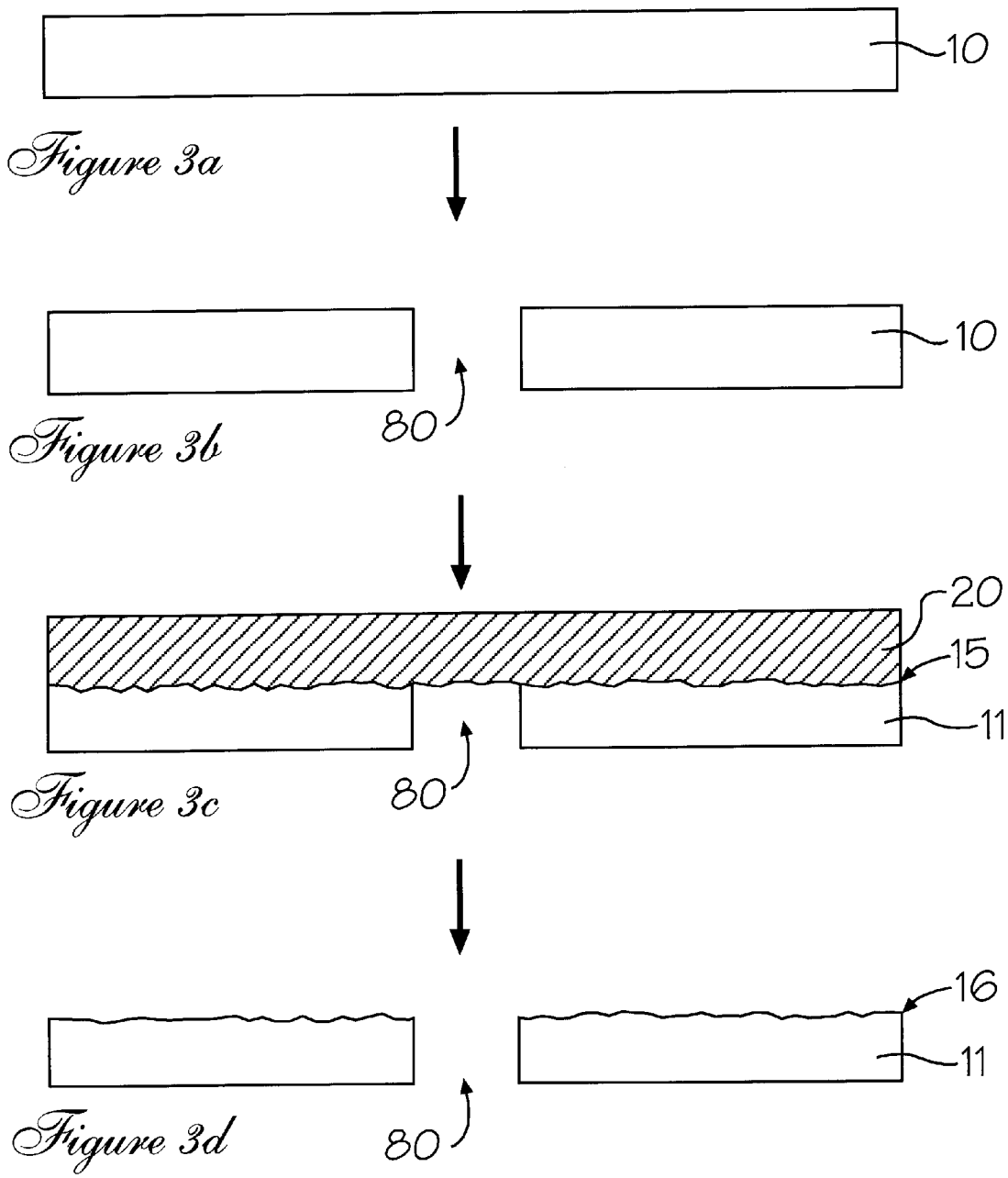
FIGS. 3a–3d are cross-sectional views for explaining the steps of another alternative embodiment containing at least one via.

For the sake of simplicity, each element maintains the same numerical representation in all of the FIGURES. It should be noted that the elements of the FIGURES are not drawn to scale and the FIGURES represent only a portion of the actual embodiment.

DESCRIPTION OF THE PREFERRED EMBODIMENT

The present inventions relies on a series of steps as outlined in the Summary, that will provide for the manufacture of high density printing wiring boards, including laminate chip carriers. Each step of the process will now be elaborated in further detail.

The dielectric substrate 10 is typically comprised of an insulative material in film form. The usual thickness of such films are 15 to 400 mils, and preferably 20 to 250 mils. These dielectric substrates are typically thermoset or thermoplastic resins and can be reinforced with glass fiber or may contain fillers. Typical thermosetting polymeric materials include epoxy, phenolic based materials and polyamides. Examples of some phenolic type materials include copolymers of phenol, resorcinol and cresol. Examples of suitable thermoplastic materials include polyolefins, such as polypropylene, polysulfones, polycarbonates, nitrile rubbers, ABS polymers and fluorinated polymeric materials such as polytetrafluoroethylene. For a discussion of useful dielectric substrate materials please see U.S. Pat. No. 5,509,557, the teachings of which are incorporated herein by reference in their entirety. Although polyimide materials may be used in the present invention they are not recommended because of their tendency to strongly retain catalyst which impairs the insulative properties of the dielectric substrate in the final printed wiring board. Preferred from among the numerous materials are polyethyleneterephthalate, polytetrafluoroethylene, bismaleimide triazine, cyanate ester, and glass epoxy. Particularly preferred is a glass epoxy designated FR-4, or one of the standard higher Tg epoxies well known in the art.

These materials when fabricated into a film do not typically provide adequate adhesion for metal plating such as electroless plating of copper. Therefore, some form of adhesion promoting treatment must be performed to the dielectric substrate prior to electroless plating of copper. As noted hereinabove the prior art has attempted to solve this problem by many different approaches. In most cases these include the use of materials that are harmful to the environment, or require lengthy and laborious processes, or render the substrate unusable and unrecoverable if errors should occur.

The present invention utilizes a microroughened surface 15 of the dielectric substrate to provide adequate adhesion to later applied metallic layers. Microroughening can be performed by either chemical or mechanical means. Preferably the present invention employs a simplified process using a copper foil 20 that has been prepared in such a way as to have itself a roughened surface. The extent of roughening can be defined by several parameters that measure such characteristics as peak height, average peak to valley heights, maximum peak to valley height, and the like. The preferred copper foils 20 for use in the application have the following characteristics:

R.sub.a=0.05–0.08 mil, R.sub.max=0.20–0.55 mil, S.sub.m=1.00–3.00 mil, R.sub.p=0.20–0.35 mil, and surface area=0.90–1.20 square mils wherein R.sub.a is the average roughness and the arithmetic mean of the departures from horizontal mean line profile. R.sub.max is the maximum peak-to-valley height; S.sub.m is the mean spacing between high spots at the mean line; R.sub.p is the maximum profile height from the mean line; and surface area is the area under the surface profile from each measurement is obtained using a Talysurf S-120 profilometer. For a discussion of useful roughened metal foils 20 please see U.S. Pat. No. 5,509,557, the teachings of which are incorporated herein by reference in their entirety.

In a preferred mode, the metal foil 20 is then placed in intimate contact with the previously selected dielectric film and the materials are placed under pressure to emboss the dielectric film substrate 10 with the mirror image roughness pattern present on the metal foil. The pressure and temperature of this process can be varied within certain parameters as long as the dielectric substrate 10 is only embossed on its surface but not deformed or chemically altered due to heating. As is obvious to one skilled in the art, these temperatures and pressures will vary with the specific dielectric material being used. Preferred conditions for this process are about 260 to about 800 psi, and most preferably 500 psi and a temperature of about 340 F for common lower Tg epoxy materials used in printed circuit fabrication. The time of the pressing operation is variable, depending upon the particular dielectric substrate material employed and pressure employed but about 1 hour is typically adequate. The pressing can be done by loading a stack of panels, each being a dielectric substrate 10, in contact with a metal foil 20, on top of each other in the press. A practical amount is about 12 panels.

After the embossing step, the metal foil 20 can be removed from the roughened dielectric substrate 11, preferably by chemically etching with a material that will not significantly attack the dielectric substrate. Etchant solutions may include cupric chloride, ferric chloride, sodium peroxydisulfate, ammonium persulfate, ammoniacal cupric chloride, and nitric acid. In general, all stripping solutions are operative in the practice of this invention, so long as they do not cause excessive attack of the dielectric substrate. For a discussion of useful etchants and process conditions please see U.S. Pat. No. 5,509,557, the teachings of which are incorporated herein by reference in their entirety.

If through holes and/or blind holes 80, generically known as vias, are required as part of the overall design, they can be drilled or otherwise formed either before or after removal of the copper foil 20. The method of formation of the holes is not critical to the process of interest here. After this step, it is generally suitable to subject the board to a water rinse and/or mild alkali bath rinse to clean the board.

To further assist in obtaining excellent adhesion of an electroless copper plating to the roughened dielectric substrate 11 a chemical pretreatment is employed. Typically, this pretreatment will produce sites on the surface of the dielectric substrate that act as catalysts for the deposition of electroless copper. It is therefore critical that each step of the treatment be uniformly applied on the surface. The pretreatment begins with a conditioning step (not shown) the facilitates the adsorption of the later applied catalyst/activator seed treatment (not shown). Although not wishing to be bound by theory, it is believed that the conditioner, typically a cationic polyacrylamide, creates a positively charged surface that attracts the colloidal catalytic particles that have a surface which is anionic in character. Equally as important is the unexpected determination that there is an optimum quantity for the catalyst. Below certain ranges insufficient catalysis occurs and above that range adhesion degrades. This range varies with the specific catalyst but can be determined by peel tests. For this invention, the peel force exceeds 3.5 pounds/inch. The catalysts that can be used in this invention are ones that aid in the process of copper deposition. Preferably these will be metals that are more noble than copper such as gold, palladium and platinum. It is within the scope of this invention, however, that the catalyst might also be a non-precious metal, such as copper, nickel, cobalt, iron, zinc, manganese, and aluminum. Preferably palladium metal and its salts are used in this invention. It is also known in the art to employ an activator material such as tin chloride to form the colloidal palladium from palladium chloride and then to keep it suspended by being adsorbed on the surface of the colloid thereby creating sufficient charge to cause electrostatic repulsion. The preformed palladium colloid and tin chloride salt is commercially available.

Electroless or autocatalytic deposition of copper onto the treated dielectric substrate surface 16 is achieved by contacting the dielectric substrate 11 with a solution comprising a copper ion source and a reducing agent. Electroless plating begins at sites on the dielectric substrate where catalyst resides and continues on the freshly plated copper surface. In this manner any reasonable thickness of plating can be obtained. Useful reducing agents for this invention include, hypophosphite, formaldehyde, formaldehyde precursors, homopolymers of formaldehyde such as paraformaldehyde and trioxane, glyoxal, hydrazine borohydrides, amino boranes such as isopropylamine borane and morpholine borane, thiourea dioxides, alkali metal borohydrides and derivatives therefrom. The preferred reducing agent is formaldehyde. In addition to the reducing agent the electroless copper plating bath also contains an aqueous composition comprising a source of cupric ion, a complexing agent for the cupric ion, a pH adjuster, chemical stabilizers, surfactants and dissolved oxygen. The cupric ion source generally used is cupric sulfate or a cupric salt of the complexing agent to be employed. The cupric ion source is employed in amounts of about 7 to about 12 grams per liter and preferably, about 8.0 to about 10.0 grams per liter and most preferably, about 8.5 to about 9.5 grams per liter calculated as $CuSO_4.5H_2O$. Examples of some suitable complexing agents include Rochelle salts, ethylene diamine tetraacetic acid, the sodium (mono-, di-, tri-, and tetra-sodium) salts of ethylene diamine tetraacetic acid, nitrilo tetraacetic acid and its alkali salts, gluconic acid, gluconates, triethanol amine, glucono (gamma-lactone, modified ethylene diamine acetates, such as N-hydroxy ethyl ethylene diamine triacetate. In addition other suitable copper complexing agents are suggested in U.S. Pat. Nos. 2,996,408; 3,075,856; 3,076,855; and 2,938,805. The preferred complexing agents are ethylene diamine tetraacetic acid and the alkali metal salts thereof. The amount of complexing agent is about 30 to about 50 grams per liter. If a surfactant is desired as part of the plating formulation to wet the surface of the roughened dielectric substrate, several surfactants are recommended. A satisfactory surfactant is, for instance, an ortho phosphate ester, available under the trade designation Rhodafac RE-610. Generally anionic and nonionic surfactants are compatible with the plating formulations. Generally, the surfactant is present in amounts from about 0.02 to about 0.3 grams per liter. The pH of the plating formulation is typically controlled by addition of a basic compound, such as sodium hydroxide or potassium hydroxide, in the desired amount to achieve the desired pH. The preferred pH is between 11.5 and 13.0 and most preferably between 12.0 and 12.5. Often, free hydroxide is controlled in the range 5–10 g/l. The temperature of the bath is maintained in a range consistent with bath stability considering the chemical concentrations and the stabilizing substances used. The optimum temperature may range from 30 C. to 75 C., but is often between 35 and 50 degrees C., and most preferably between about 40 degrees C. and about 50 degrees C. Plating time depends strictly on plating rate and desired thickness, with rates in the 0.1–0.2 mil/hr range being satisfactory for plating times of 15 to 30 minutes. Best results are obtained with rates in the 0.15–0.20 mil/hr range and plating times of 15–20 minutes.

The thickness of the electroless plated copper 30 is of critical importance to the optimization of the present invention. Preferred thickness of the copper plated layer is about 10–100 microinches, most preferred thicknesses are about 10–50 microinches and optimal thicknesses are about 10–25 microinches. Significantly below 10 microinches the electroless copper plated layer does not provide an adequate foundation for the subsequent electroplated copper; while above 100 microinches the benefit of facile etching of the electroless copper layer, required in later steps to generate the independent copper features, is lost. It should be noted that electroless plating 30 of the dielectric substrate 11 occurs not only on the exposed, uppermost lateral faces 16 of the dielectric substrate, but if though holes or blind holes 80 were a required design feature of the final printed wiring board, these too would have been electrolessly plated 83. A significant benefit of this inventive process is the ability to obtain a conductive surface 31 within the through hole and blind hole. Additionally, layer thickness values of 10–100 microinches cannot be easily achieved using copper foil lamination because the copper foil will be too thin to be easily handled in a manufacturing operation.

Furthermore, since the industry is moving to higher density printed wiring boards, through hole diameter is decreasing (i.e., holes possess higher aspect ratios). High aspect ratio through holes are very difficult to plate be means other than electroless plating. Neither sputtering nor foil application (other methods of making the surface of the dielectric substrate conductive) are amenable to making high aspect through holes conductive. This is especially true of sputtering when the aspect ratio of the plated through holes is greater than 5. Under these conditions where the aspect ratio is greater than 5, a significant benefit of this invention is derived.

Subsequent to electroless copper plating 30 the uppermost surface or surfaces and optional through holes and blind holes of the catalyzed and roughened dielectric substrate 11, a layer of photoresist 40 is applied to the uppermost lateral surface of the electroless plated copper layer 30 for the purpose of performing photolithography. The resist material can be in either a liquid or solid formulation. A solid resist is placed in intimate contact with the uppermost copper layer, while the liquid resist can be applied by immersion, spin coating or other liquid application methodology (e.g., cascade coating) or by aerosol. Either positive or negative photoresists can be employed in the present invention. An example of a positive working photoresist is based on phenol formaldehyde novalak polymers which contain therein a diazoketone such as 2-diazo-1naphthol-5-sulfonic acid ester. A material of this type is sold by Shipley as AZ1350. Preferred photoresists are negative working, photohardenable polymerizable compositions. These polymeric materials are either composed of monomers derived exclusively from acrylates or methacrylates or in addition also contain other olefinic monomers such as styrene and maleic anhydride isobutyl ester. Particularly preferred photoresists are dry film resists marketed for use in pattern electroplating. The photoresist material is typically applied to a thickness of about 0.6 to 3.0 mils to ensure that later copper electroplating will not overflow the discontinuities created from the exposed and developed photoresist. The layer of photoresist is then selectively exposed to the desired pattern by known techniques, such as ultraviolet light, electron beam, or X-ray beam irradiation through a mask. In the case of the negative resist materials, the irradiation is then followed by removal of the unexposed portions by etching or dissolution (also called developing) in an appropriate liquid, typically of alkaline pH.

The development process of the photoresist creates discontinuities 48 in the photoresist layer and these discontinuities have as their bottom surface the uncovered electroless plated copper layer 30. Specifically for negative working photoresist systems, in unexposed areas, photoresist that has not undergone photopolymerization is still soluble and in alkaline media will be dissolved. This dissolution process uncovers the underlying layer of electroless copper. In this manner these discontinuities and the underlying electroless copper layer will be later electroplated to create the copper features 50 of the final printed wiring board. This process is known in the art as personalization since the unique sites for subsequently formed circuits and features have now been created.

The dielectric substrate 11 comprising the electroless copper layer 30 on its uppermost surface and in turn the developed photoresist 45 on the uppermost surface of electroless copper layer can be optionally cleaned to remove oxides and residual traces of undissolved photoresist that may remain on the exposed electroless copper layer. Most copper etching formulations will serve this purpose, but since the electroless copper layer 30 is exceedingly thin it is critical that mild conditions be employed. It is most preferred to use formulations that are considered microetchants or cleaning compositions rather than the stronger etching compositions. A preferred formulation utilizes sodium persulfate at a concentration of 35–45 g/l and a temperature of 74–84 degrees F. having a contact time of one minute.

Electroplating is the next step in the process and is performed to create the final copper features or circuitry. The uncovered electroless copper layer 35 residing on the dielectric substrate acts as the site for copper deposition. Electroplating can be performed using any of a variety of formulations available commercially, as long as the particular formulation is appropriate for the current density used and will produce acceptable results for surface thickness distribution and plated thickness in the holes 84.

After electroplating the dielectric substrate the remaining photoresist must be removed or stripped to reveal the final copper features 50 and unplated copper commoning layer 30. Most commonly available dry film photoresist materials 45 may be removed or stripped using solutions of strong alkali such as sodium hydroxide.

At this point in the process the copper features 50 are still electrically and physically connected to the electroless copper commoning layer 30 so etching of the commoning layer is required to produce copper features 51 that are electrically isolated from one another. Since the commoning layer is so thin relative to the height of the copper features and also because it is composed of electroless plated copper, etching conditions can be very mild and only insignificant attack to the copper features need occur. For this reason it is not necessary to provide an etch mask to the uppermost surface of the copper features. However, if for other reasons, for example adhesion to subsequent layers, a metal etch mask is desired the present invention can provide for its addition. Preferred conditions for etching the commoning layer include using a solution containing sodium persulfate at a concentration of 35–45 g/l, 95% sulfuric acid at a concentration of 40–60 ml/l and a temperature of 74–84 degrees F., with a contact time of 15 to 45 seconds.

EXAMPLE 1

Printed circuits were fabricated using the methods described above. Surface roughened parts 11 were processed through Shipley 3320 (0.47N, pH 2.1, 48 C, 6.5 minutes), Shipley 748 microetch (1.8 g/l "active oxygen", 1.5% v/v sulfuric acid, 12 g/l copper, 30 C, 30 seconds), Shipley 404 Predip (specific gravity 1.15, 26 C, 1.5 minute), Shipley Cataposit 44 (3% catalyst concentration, SnC12 6 g/l, HCl 0.55 N, specific gravity 1.165, 5.25 minutes), and Shipley 3350 electroless copper (48 C, free hydroxide 7.75 g/l, formaldehyde 2.8 g/l, EDTA 35 g/l, copper 2.0 g/l, 20 minutes). The electroless copper layer 30 was approximately 60 microinches thick. After electroless copper plating, parts were cleaned using 10% v/v sulfuric acid solution, and aqueous dry film photoresist 40 was applied, exposed and developed. The imaged commoning layer 38 of the parts were then microetched in sodium persulfate solution (30 seconds, ambient temperature, agitation 10 cycles/minute, three inch stroke length, 40 g/l Na2S2O8, 40 ml/l 95% H2SO4) and copper electroplated into circuit features 50 using Shipley Electroposit 1100 acid copper. Current densities were in the 5–15 ASF range. After stripping the photoresist 45 using sodium hydroxide solution, the commoning layer 30 was etched using sodium persulfate (40 g/l Na2S2O8, 50 ml/l 95% H2SO4, 79 degrees F., 90 seconds) in a conveyorized spray processing system. Circuit features 51 were sharply defined without tailing or electrical shorts between adjacent features. Testing for electrical shorts was performed at 500 Volts with a minimum of 100 Mohm to pass.

EXAMPLE 2

When parts were fabricated using the above process, circuit line adhesion was affected, as expected, by the type of foil 20 used to roughen the surface, as shown in the following table. Experiment showed that for a particular high Tg epoxy resin (Driclad (R), Tg approximately 165 C, line adhesion using the described process was better than that obtained using a full build electroless copper process. Foils denoted A and B below were commercially available half ounce per square foot copper foils for printed circuit application. The "A" material had greater roughness on the laminate side than standard half ounce foil and did not have the silane treatment typical of this vendor's standard foils. Copper foil denoted "B" was typical half ounce copper foil, including the silane treatment and without enhanced roughness on the laminate side.

Preferred roughness values for the present invention are given for Foil A as compared to the prior art Foil B roughness values.

| Foil type | Line width, mils | Average peel force, pounds/inch |
|---|---|---|
| A | 4.1 | 4.8 |
| A | 4.1 | 4.2 |
| B | 3.6 | 3.9 |

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method for fabricating a printed wiring board, comprising steps of:

a) laminating a dielectric substrate to a surface-roughened metallic foil for embossing a surface of said dielectric substrate;

b) removing said roughened metallic foil to expose said dielectric substrate embossed surface;

c) forming at least one via in said dielectric substrate;

d) applying a conditioning treating agent to said embossed surface and a via surface;

e) applying a catalyst to said conditioned embossed surface and said conditioned via surface;

f) electrolessly plating a uniform copper commoning layer on said catalyst conditioned embossed surface and conditioned via surface; said uniform copper commoning layer having a thickness no greater than 100 microinches;

g) selectively plating on said uniform copper commoning layer of said catalyst conditioned embossed surface using photolithographic and semi-additive plating processes to generate multiple copper features and at least one fully plated via; said copper features and said fully plated vias being electrically connected to each other through said copper commoning layer; and h) etching said copper commoning layer to provide electrically isolated copper features and at least one said fully plated via.

2. The method for fabricating a printed wiring board as recited in claim 1, wherein said via has an aspect ratio greater than 5.

3. The method for fabricating a printed wiring board as recited in claim 1, wherein said conditioning treating agent comprises cationic polyacrylamides.

4. The method for fabricating a printed wiring board as recited in claim 1, wherein said catalyst is selected from the group consisting of palladium metal, palladium salts, and colloidal palladium-tin particles.

5. The method for fabricating a printed wiring board as recited in claim 4, wherein said catalyst is a palladium-tin particulate composition.

6. The method for fabricating a printed wiring board as recited in claim 5, wherein a concentration of said palladium-tin particulate in said catalyst is approximately 0.5 g/liter.

7. The method for fabricating a printed wiring board as recited in claim 5, wherein said palladium-tin particulate is applied to said embossed surface of said dielectric substrate at a rate of approximately 0.5 micrograms/square cm.

8. The method for fabricating a printed wiring board as recited in claim 1, wherein said step (c) can be performed prior to any of said steps (a), (b), or (d).

9. The method for fabricating a printed wiring board as recited in claim 1, wherein said roughened metallic foil comprises copper.

10. The method for fabricating a printed wiring board as recited in claim 1, wherein said removing said roughened metal foil comprises use of chemical etchants.

11. The method for fabricating a printed wiring board as recited in claim 10, wherein said chemical etchants are selected from the group consisting of cupric chloride, ferric chloride, sodium peroxydisulfate, ammonium persulfate, ammoniacal cupric chloride, and nitric acid.

12. The method for fabricating a printed wiring board as recited in claim 1, wherein said catalyst is selected from the group consisting of palladium, copper, nickel, cobalt, iron, zinc, manganese, aluminum, and their corresponding salts.

* * * * *